United States Patent [19]

Koike

[11] Patent Number: 4,794,374
[45] Date of Patent: Dec. 27, 1988

[54] FLASH A/D CONVERTER
[75] Inventor: Yukio Koike, Tokyo, Japan
[73] Assignee: NEC Corporation, Tokyo, Japan
[21] Appl. No.: 45,996
[22] Filed: May 4, 1987
[30] Foreign Application Priority Data May 2, 1986 [JP] Japan ................................ 61-102401

[51] Int. Cl.$^4$ ............................................ H03M 1/36
[52] U.S. Cl. .................................. 341/120; 307/451;
307/585; 341/155
[58] Field of Search ................... 340/347 AD, 347 M;
328/151; 364/178, 179; 358/138; 307/451, 585,
304

[56] References Cited
U.S. PATENT DOCUMENTS 4,507,649 3/1985 Dingwall et al. ............... 307/585 X

OTHER PUBLICATIONS

Fujita et al., A Bulk CMOS 20MS/s 7 b Flash ADC, 1984, IEEE International Solid-State Circuits Conference, pp. 56 and 57.

Primary Examiner—T. J. Sloyan
Attorney, Agent, or Firm—Sughrue, Mion, Zinn, Macpeak & Seas

[57] ABSTRACT

An A/D converter comprises a resistor ladder connected between first and second reference potentials so that each connection tap provides a different divided reference potential. A plurality of first switches are each connected at their one end to one connection tap of the resistor ladder and at their other end to a corresponding number of common connection nodes. Also, a plurality of second switches are each connected at their one end commonly to an input for an analog voltage signal and at their other end to the corresponding common connection nodes. Each of the nodes is connected through one coupling capacitor to one amplifier having adapted to generate an output signal representative of whether the voltage of the input signal is higher or lower than a voltage appearing at the above mentioned one connection tap of the resistor ladder. Each of the amplifier has a third switch connected between the input and the output of the amplifier, and an encoder is connected to the output of each amplifier so as to generate an digital signal corresponding to the input analog signal. Each of the common connection nodes are connected through an associated fourth switch to a bias voltage source. In a pre-calibration period proceeding to a calibration period, the third and fourth switches are closed so that the respective common connection nodes are forcedly and rapidly charged or discharged through the bias voltage source.

9 Claims, 4 Drawing Sheets $B_i (i=1\sim63)$

FLASH A/D CONVERTER

BACKGROUND OF THE INVENTION

1. Field of the Invention

The present invention relates to an A/D converter (analog-to-digital converter), and more specifically, to a high speed A/D converter which can be formed in an integrated circuit of a small chip size.

2. Description of Related Art

Heretofore, various types of A/D converters have been proposed, and some of them are actually used in different fields. Among these A/D converters, a so-called "flash" A/D converter is known which includes comparators of the number corresponding to a required resolution of the A/D converter so that an input signal is simultaneously compared with different reference voltages by all the comparators and one digital signal is generated. One typical flash A/D converter is proposed by Andrew G. F. DINGWALL in IEEE J. Solid-State Circuits, vol. SC-14, pp 926-932, December 1979. The flash A/D converter requires a large number of elements, but can realize a conversion rate near to a response speed of the device. Therefore, the flash A/D converter can effectively be used in various fields requiring a high speed conversion.

Referring to FIG. 1, there is shown a typical conventional flash A/D converter, which is adapted to convert an input analog signal to a 6-bit digital signal. The shown A/D converter includes a resistor ladder 10 composed of a plurality of resistors $R_0$-$R_{63}$ series-connected between a first reference potential $+V_{ref}$ and a second reference potential $-V_{ref}$ so that a connection tap $T_1$-$T_{63}$ between each pair of adjacent resistors provides a different divided reference potential $V_1$-$V_{63}$. The connection taps $T_1$-$T_{63}$ are connected through a corresponding number of switches $S_{11}$-$S_{631}$ to a corresponding number of connection nodes $N_{11}$-$N_{631}$, respectively. On the other hand, an input 12 for an analog voltage signal $V_{IN}$ is connected to all the connection nodes $N_{11}$-$N_{631}$ through switches $S_{12}$-$S_{632}$ of the same number as that of the switches $S_{11}$-$S_{631}$, respectively.

The connection nodes $N_{11}$-$N_{631}$ are connected to one end of the same number of coupling capacitors $CC_1$-$CC_{63}$, respectively. The other ends of these coupling capacitors $CC_1$-$CC_{63}$ are connected to the same number of another connection nodes $N_{12}$-$N_{632}$, respectively, which are in turn connected to inputs of inverting amplifiers $A_1$-$A_{63}$. An output of each amplifier $A_1$-$A_{63}$ are connected to the input of the amplifier per se through a short-circuiting switches $S_{13}$-$S_{633}$, and further coupled to an encoder 14 having a 6-bit output 16.

The above switches $S_{11}$-$S_{631}$, $S_{12}$-$S_{632}$ and $S_{13}$-$S_{633}$ are controlled by a switch controller 18.

An operation of the A/D converter is divided into a calibration period and a comparison period.

In the calibration period, the controller 18 causes to close the switches $S_{11}$-$S_{631}$ and $S_{13}$-$S_{633}$ and to maintain the switches $S_{12}$-$S_{632}$ in an open condition. Therefore, the connection nodes $N_{11}$-$N_{631}$ are applied with respective divided reference voltages $V_1$-$V_{63}$ given by the respective taps $T_1$-$T_{63}$ of the resistor ladder 10. Namely, the one electrode of the coupling capacitor $CC_1$-$CC_{63}$ are brought to the divided reference voltages $V_1$-$V_{63}$, respectively. On the other hand, since the input and output of each amplifier $A_1$-$A_{63}$ are short-circuited by the closed associated switches $S_{13}$-$S_{633}$, the nodes $N_{12}$-$N_{632}$ and hence the other electrodes of the coupling capacitors $CC_1$-$CC_{63}$ are brought to respective threshold voltages $V_{TH1}$-$V_{TH63}$ of the amplifiers $A_1$-$A_{63}$, respectively. Namely, each of the capacitors $CC_1$-$CC_{63}$ stores an electric charge of the amount corresponding to the voltage difference $(V_1-V_{TH1})$, ... $(V_{63}-V_{TH63})$.

In the comparison period succeeding to the calibration period, the controller 18 turns the switches $S_{11}$-$S_{631}$ and $S_{13}$-$S_{633}$ off and the switches $S_{12}$-$S_{632}$ on. As a result, the nodes $N_{11}$-$N_{631}$ are brought to the input voltage $V_{IN}$. At this time, since the switches $S_{13}$-$S_{633}$ are opened, the capacitors $CC_1$-$CC_{63}$ maintain the electric charges corresponding to voltage differences $(V_1-V_{TH1})$, ... $(V_{63}-V_{TH63})$.

In general, an inverting amplifier is set to have a threshold voltage $V_{TH}$ at a high point in the gain range of the inverting amplifier. Therefore, if the input voltage of each inverting amplifier $A_1$-$A_{63}$ is shifted slightly from the threshold voltage $V_{TH}$-$V_{TH63}$ of the inverting amplifier per se, the amount of the shift is amplified so that the inverting amplifier outputs either a high voltage H or a low voltage L, which can in turn correspond to "1" and "0" of a binary number. If the input voltage $V_{IN}$ is smaller than one divided reference voltage $V_i$, an input voltage of an inverting amplifier $A_i$ (i=1-63) becomes lower than a threshold voltage $V_{THi}$ of the amplifier $A_i$, so that the amplifier $A_i$ generates a high voltage output H corresponding to a logic level "1". But, if the input voltage $V_{IN}$ is larger than one divided reference voltage $V_i$ (i=1-63), an input voltage of an inverting amplifier $A_i$ becomes higher than a threshold voltage $V_{THi}$ (i=1-63) of the amplifier $A_i$, so that the amplifier $A_i$ generates a low voltage output L corresponding to a logic level "0".

As seen from FIG. 1, the divided reference voltages $V_1$ ... $V_{63}$ come under the relation $V_1 < V_2 < ... < V_{63}$. Therefore, if the input voltage $V_{IN}$ is between the first reference voltage $+V_{ref}$ and the second reference voltage $-V_{ref}$, an inverting amplifier $A_i$ which has been applied with a divided reference voltage $V_i$ fulfiling the relation $V_{IN} > V_i$, the inverting amplifier $A_i$ will generate a low logic voltage output L. On the other hand, an inverting amplifier $A_i$ which has received an divided reference voltage $V_i$ fulfiling the relation $V_{IN} < V_i$ will generate a high logic voltage output H.

The outputs of all the amplifiers $A_1$-$A_{63}$ are supplied to the encoder 16, where the pattern of the amplifier outputs is detected and converted to a 6-bit digital signal.

In the A/D converter as mentioned above, when either the switches $S_{11}$-$S_{631}$ or the switches $S_{12}$-$S_{632}$ are closed to form wiring circuits to the associated coupling capacitors $CC_1$-$CC_{63}$, respectively, the nodes $N_{11}$-$N_{631}$ will have parasitic capacitances $CS_1$-$CS_{63}$, respectively. These parasitic capacitances $CS_1$-$CS_{63}$ are charged or discharged every time the voltages of the respective nodes $N_{11}$-$N_{63}$ are changed between the respective divided reference voltages $V_1$-$V_{63}$ and the analog input voltage $V_{IN}$. But, in order to ensure precise A/D conversion of the input analog voltage $V_{IN}$, the charge/discharge time is required to be sufficiently smaller than the calibration period and the comparison period.

Specifically, in the comparison period, the charge/discharge time is determined by an impedance of a source supplying the analog voltage $V_{IN}$, a resistance of each switch $S_{12}$–$S_{632}$ and each parasitic capacitance $CS_1$–$CS_{63}$. On the other hand, in the calibration period, the charge/discharge time is determined by an impedance of the resistor ladder 10 generating the respective divided reference voltages, a resistance of each switch $S_{11}$–$S_{631}$ and each parasitic capacitance $CS_1$–$CS_{63}$. Therefore, in order to shorten the charge/discharge time, it is preferable to decrease the resistance of each resistor $R_0$–$R_{63}$ in the resistor ladder 10.

Furthermore, in the case that the input voltage $V_{IN}$ will gradually change in comparison with the A/D conversion rate, electric charges stored in the parasitic capacitances $CS_1$–$CS_{63}$ will fluctuate the respective divided reference voltages $V_1$–$V_{63}$. For example, before the comparison period is shifted to the calibration period, the analog input voltage $V_{IN}$ is applied through the switch $S_{12}$ to the node $N_{11}$ so that the parasitic capacitance $CS_1$ stores an electric charge, and thereafter, when it is shifted to the calibration period, the electric charge of the parasitic capacitance $CS_1$ influence the divided reference voltage $V_1$ through the closed switch $S_{11}$. This fluctuation caused by the parasitic capacitance is difficult to correct, since the amount of electric charge stored in the parasitic capacitance will be varied in dependence of the analog input voltage $V_{IN}$. In the conventional A/D converter, accordingly, the resistors $R_0$–$R_{63}$ have to have a low resistance to the extent that the divided reference voltages $V_1$–$V_{63}$ are not influenced.

However, the decrease in the resistance of the resistors $R_0$–$R_{63}$ will result in increased dissipation current. This will require an A/D converter device to have not only a large current density but also a large chip size. The former is not preferable in the view point of reliability, and the latter is not convenient in cost performance.

SUMMARY OF THE INVENTION

Accordingly, it is an object of the present invention to provide an A/D converter which has overcome the above mentioned drawbacks of the conventional one.

Another object of the present invention to provide an A/D converter having a high conversion rate and precision and capable of using a resistor ladder composed of high resistance resistors so that a power dissipation is lowered.

Still another object of the present invention is to provide a high speed flash A/D converter which can be easily realized in the form of a MOS integrated circuit.

The above and other objects of the present invention are achieved in accordance with the present invention by an A/D converter comprising a resistor ladder composed of a plurality of resistors series-connected between a first reference potential and a second reference potential different from the first reference potential so that a connection tap between each pair of adjacent resistors provides a different divided reference potential; at least one first switch means connected at its one end to one connection tap of the resistor ladder and at its other end to a common connection node; at least one second switch means connected at its one end to an input for an analog voltage signal and at its other end to the common connection node; at least one coupling capacitor connected at its one end to the common connection node; at least one amplifier having an input connected to the other end of the coupling capacitor and an output adapted to generate an output signal representative of whether the voltage of the input signal is higher or lower than a voltage appearing at the above mentioned one connection tap of the resistor ladder; at least one third switch means connected between the input and the output of the amplifier; a bias voltage means; at least one fourth switch means connected between the bias voltage means and the common connection node; an encoder means connected to the output of the amplifier so as to generate an digital signal corresponding to the input analog signal; and a switch controller for controlling the on-off of the first, second, third and fourth switch means in such a manner that in a pre-calibration period the third and fourth switch means are closed so that the common connection node is forcedly or discharged through the bias voltage means; in a calibration period succeeding to the pre-calibration period the first and third switch means are closed so that the divided reference potential is stored in the coupling capacitor connected to the common connection node; and in a comparison period succeeding to the calibration period only the second switch means is closed so that the analog signal voltage is supplied through the common connection node to the coupling capacitor.

With the above arrangement, the bias voltage means is connected through the fourth switch means to the common connection node which is selectively connected through the first switch means to the resistor ladder and through the second switch means to the input for the analog signal. Therefore, an electric charge stored in parasitic capacitance produced at the common connection node can be forcedly and rapidly charged or discharged by closing the fourth switch means in the pre-calibration period. Accordingly, the resistance of each resistor of the resistor ladder can be increased. Namely, a high speed, high precision and low power dissipation A/D converter suitable to a MOS integrated circuit can be realized.

The above and other objects, features and advantages of the present invention will be apparent from the following description of the preferred embodiment of the invention with reference to the accompanying drawings.

DESCRIPTION OF THE PREFERRED EMBODIMENT

Figure 2:
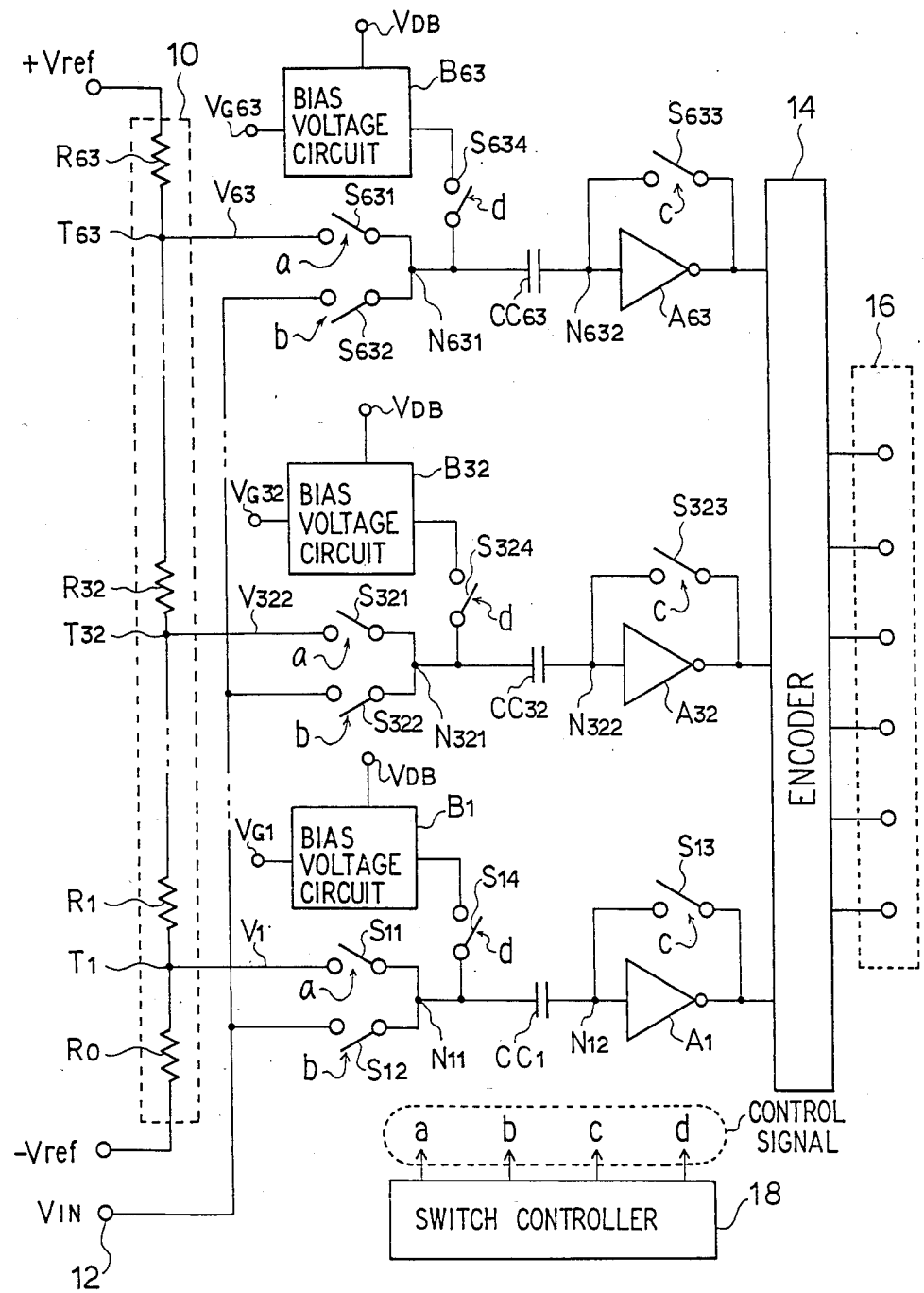
FIG. 2 is a diagram similar to FIG. 1 but showing an embodiment of the flash A/D converter in accordance with the present invention.

Referring to FIG. 2, there is shown one embodiment of a flash A/D converter in accordance with the present invention, which is adapted to convert an input analog signal to a 6-bit digital signal. The shown A/D converter includes a resistor ladder 10 composed of a plurality of resistor $R_0$–$R_{63}$ series-connected between a first reference potential $+V_{ref}$ and a second reference potential $-V_{ref}$ so that a connection tap $T_1$–$T_{63}$ between each pair of adjacent resistors provides a different divided reference potential $V_1$-$V_{63}$. The connection taps $T_1$-$T_{63}$ are connected through a corresponding number of switches $S_{11}$-$S_{631}$ to a corresponding number of common connection nodes $N_{11}$-$N_{631}$, respectively. On the other hand, an input 12 for an analog voltage signal $V_{IN}$ is connected to all the connection nodes $N_{11}$-$N_{631}$ through switches $S_{12}$-$S_{632}$ of the same number as that of the switches $S_{11}$-$S_{631}$, respectively.

The common connection nodes $N_{11}$-$N_{631}$ are connected to one end of the same number of coupling capacitors $CC_1$-$CC_{63}$, respectively. The other ends of these coupling capacitors $CC_1$-$CC_{63}$ are connected to the same number of another connection nodes $N_{12}$-$N_{632}$, respectively, which are in turn connected to inputs of inverting amplifiers $A_1$-$A_{63}$. An output of each amplifier $A_1$-$A_{63}$ are connected to the input of the amplifier per se through a short-circuiting switches $S_{13}$-$S_{633}$, and further coupled to an encoder 14 having a 6-bit output 16.

Figure 1:
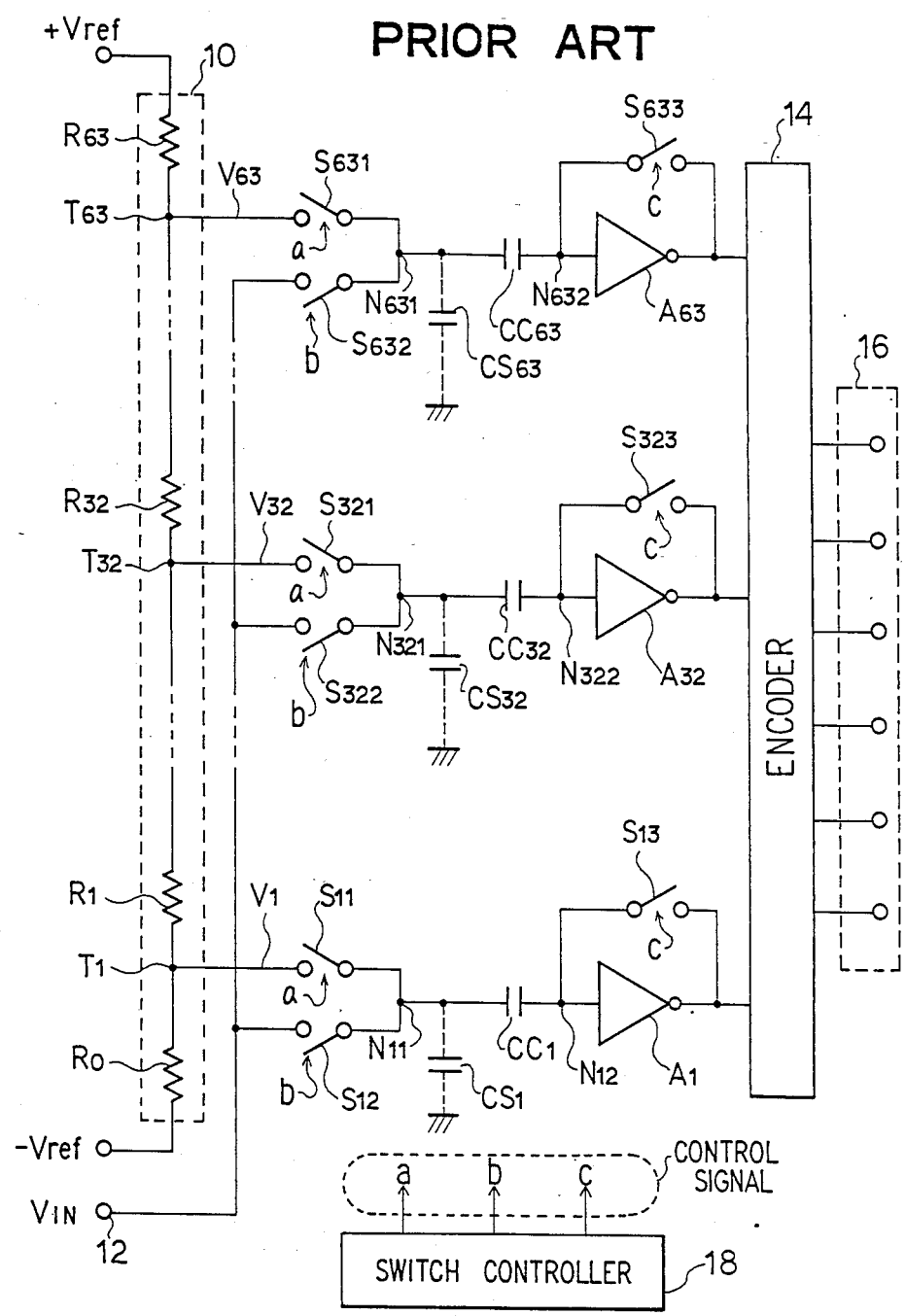
FIG. 1 is a circuit diagram of a conventional flash A/D converter.

The construction as mentioned above is the same as that of the A/D converter shown in FIG. 1.

In addition, in accordance with the present invention, each of the common connection nodes $N_{11}$-$N_{631}$ are connected through an associated fourth switch $S_{14}$-$S_{634}$ to an associated bias voltage circuit $B_1$-$B_{63}$ connected to a bias voltage source $V_{DB}$.

The first, second, third and fourth switches $S_{11}$-$S_{631}$, $S_{12}$-$S_{632}$, $S_{13}$-$S_{633}$ and $S_{14}$-$S_{634}$ are controlled by a switch controller 18 in such a manner that: in a pre-calibration period only the third and fourth switches $S_{13}$-$S_{633}$ and $S_{14}$-$S_{634}$ are closed so that the respective common connection nodes $N_{11}$-$N_{631}$ are charged or discharged through the bias voltage circuits $B_1$-$B_{63}$; in a calibration period succeeding to the pre-calibration period only the first and third switches $S_{11}$-$S_{631}$ and $S_{13}$-$S_{633}$ are closed so that the divided reference potentials $V_1$-$V_{63}$ applied to the respective common connection nodes $N_1$-$N_{63}$; and in a comparison period succeeding to the calibration period only the second switches $S_{12}$-$S_{632}$ are closed so that the analog signal voltage $V_{IN}$ is supplied to all the common connection nodes $N_1$-$N_{63}$.

Figure 3:
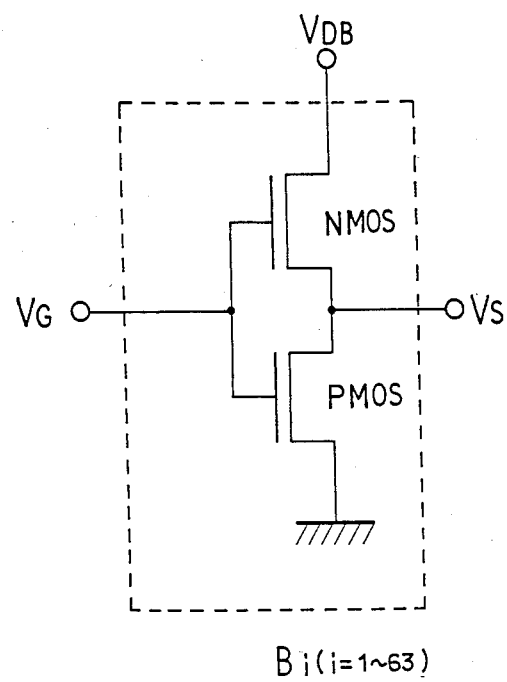
FIG. 3 is a circuit diagram showing an example of the bias voltage circuit shown in FIG. 2.

Each of the bias voltage circuits $B_1$-$B_{63}$ is constituted of a low internal impedance, self-controlled on-off circuit, and therefore, for example, can be composed of a CMOS circuit shown in FIG. 3. Namely, the CMOS circuit includes a pair of NMOS FET and PMOS FET connected in series between ground and the bias voltage source $V_{DB}$. Gates of the PMOS and the NMOS are commonly connected to receive a gate voltage $V_G$, and sources of these PMOS and NMOS are directly connected to each other and also connected to the corresponding common connection node $N_i$ (i=1-63).

Specifically, in the shown embodiment, the divided reference voltage $V_{10}$ is applied as the gate voltage $V_G$ to the bias voltage circuits $B_1$-$B_{20}$ associated to the common connection nodes $N_1$-$N_{20}$ which receive the divided reference voltages $V_1$-$V_{20}$, respectively. The divided reference voltage $V_{32}$ is applied as the gate voltage $V_G$ to the bias voltage circuits $B_{21}$-$B_{43}$ associated to the common connection node $N_{21}$-$N_{43}$ receiving the divided reference voltages $V_{21}$-$V_{43}$, respectively. Further, the divided reference voltage $V_{54}$ is applied as the gate voltage $V_G$ to the bias voltage circuits $B_{44}$-$B_{63}$ associated to the common connection node $N_{44}$-$N_{63}$ receiving the divided reference voltages $V_{44}$-$V_{63}$, respectively.

Now, operation of the A/D converter as mentioned above will be described with reference to FIGS. 4 and 5. First of all, the operation period of the A/D converter is divided into the pre-calibration period, the calibration period and the comparison period, as mentioned hereinbefore.

Figure 4:
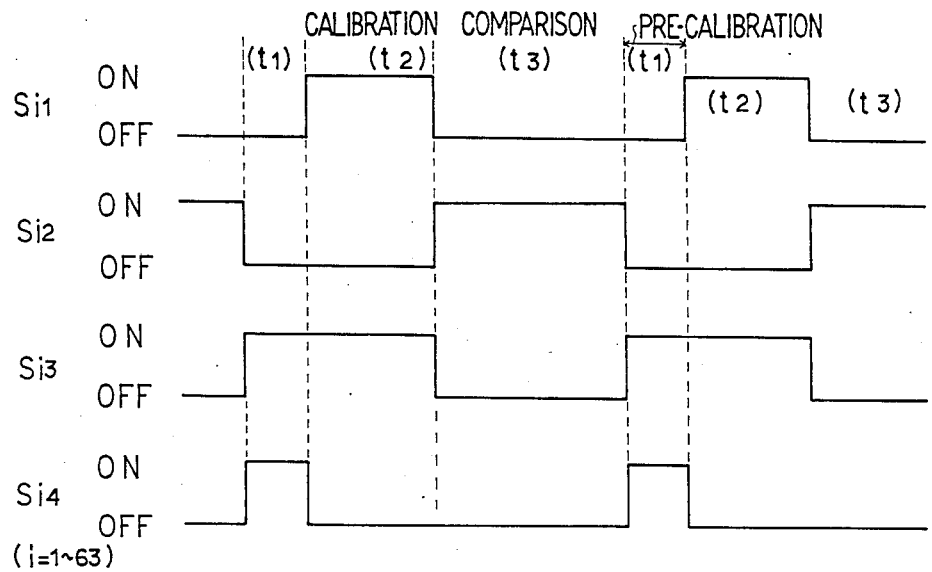
FIG. 4 is a time chart illustrating the on-off periods of the switches used in the A/D converter shown in FIG. 2.
Figure 5:
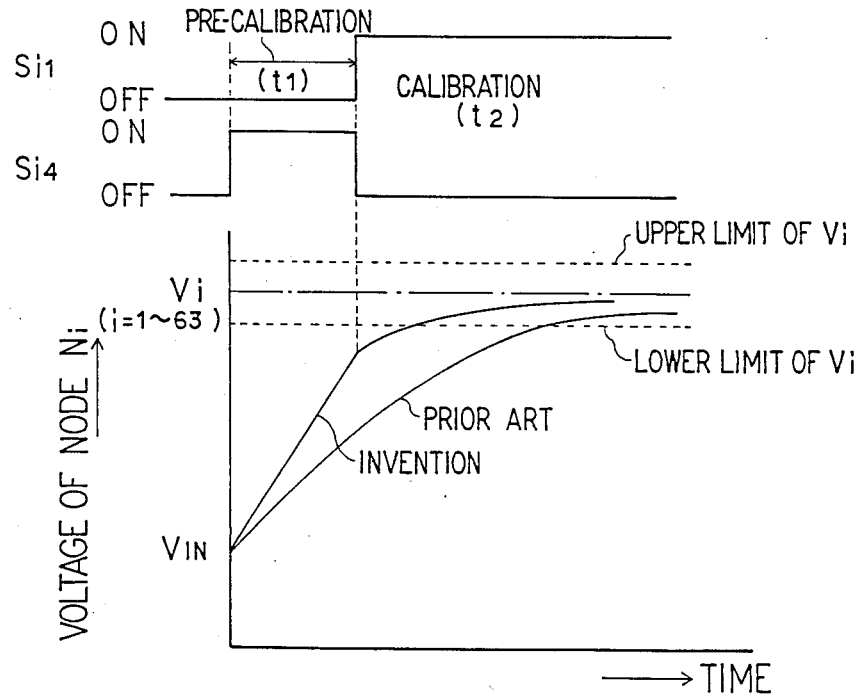
FIG. 5 is a combined time chart and graph showing a voltage change of the common connection node shown in FIG. 2.

In the pre-calibration period $t_1$, only the switches $S_{13}$-$S_{633}$ and $S_{14}$-$S_{634}$ are closed and the other switches $S_{11}$-$S_{631}$ and $S_{12}$-$S_{632}$ are maintained in an open condition as shown in FIG. 4. In this period $t_1$, assuming that the FETs PMOS and NMOS have respective drop voltages $V_{TP}$ and $V_{TN}$ in a conductive condition, the nodes $N_{11}$-$N_{201}$ corresponding to the divided reference voltages $V_1$-$V_{20}$ are respectively charged or discharged to change from an analog input voltage $V_{IN}$ in the just proceeding comparison period to a potential included in a range of $V_{10}+|V_{TP}|$ to $V_{10}-V_{TN}$. Further, the nodes $N_{211}$-$N_{431}$ corresponding to the divided reference voltages $V_{21}$-$V_{43}$ are respectively charged or discharged to change from the analog input voltage $V_{IN}$ in the just proceeding comparison period to a potential included in a range of $V_{32}+|V_{TP}|$ to $V_{32}-V_{TN}$. The nodes $N_{441}$-$N_{631}$ corresponding to the divided reference voltages $V_{44}$-$V_{63}$ are respectively charged or discharged to change from the analog input voltage $V_{IN}$ in the just proceeding comparison period to a potential included in a range of $V_{54}+|V_{TP}|$ to $V_{54}-V_{TN}$. In other words, the respective parasitic capacitances of the common connection nodes $N_{11}$-$N_{631}$ are rapidly charged or discharged through the FET PMOS of the associated bias voltage circuit $B_i$ if the gate voltage $V_G$ is smaller than the analog signal voltage $V_{IN}$, and through the FET NMOS if the voltage $V_G$ is higher than the analog signal voltage $V_{IN}$.

In the succeeding calibration period $t_2$, only the switches $S_{11}$-$S_{631}$ and $S_{13}$-$S_{633}$ are closed and the other switches $S_{12}$-$S_{632}$ and $S_{14}$-$S_{634}$ are opened. The operation of this period is similar to the calibration period of the A/D converter shown in FIG. 1. Namely, the coupling capacitors $CC_1$-$CC_{63}$ respectively store electric charges corresponding to respective voltage differences between the divided reference voltages $V_1$-$V_{63}$ and the threshold voltages $V_{TH1}$-$V_{TH63}$ of the inverting amplifiers $A_1$-$A_{63}$. In this embodiment, however, since the parasitic capacitances of the common nodes $N_{11}$-$N_{631}$ have already been charged or discharged to the respective voltages near to the respective divided reference voltage $V_1$-$V_{63}$ in the proceeding pre-calibration period, even if the resistors $R_0$-$R_{63}$ have relatively large resistances, the coupling capacitors $CC_1$-$CC_{63}$ are charged or discharged for a short time so as to have the above mentioned voltage differences $(V_1-V_{TH1}) \ldots (V_{63}-V_{TH63})$, respectively, as seen from FIG. 5.

As mentioned above, the parasitic capacitance of each common connection nodes $N_{11}$-$N_{631}$ is forcedly charged or discharged in each pre-calibration period, so that the node can rapidly reach the divided reference voltage $V_i$ in the succeeding calibration period.

In the comparison period $t_3$ succeeding to the calibration period, only the switches $S_{12}$-$S_{632}$ are closed, and the other switches are open, so that the analog signal voltage $V_{IN}$ is applied to all the nodes $N_{11}$-$N_{631}$ in place of the respective divided reference voltages $V_1$-$V_{63}$. The operation of this comparison period is completely the same as that of the A/D converter shown in FIG. 1.

As seen from the above, with provision of the precalibration period before the calibration period, the time constant attributable to the parasitic capacitances $CS_1$–$CS_{63}$ of the common nodes $N_{11}$–$N_{631}$ can be made smaller without decreasing the resistance of the resistors $R_0$–$R_{63}$.

In the respective bias voltage circuits, a current will flow through the FET PMOS or NMOS until the voltage of each parasitic capacitance of the nodes $N_{11}$–$N_{631}$ is charged or discharged to a predetermined voltage (included in the range of $V_{10}+|V_{TP}|$ to $V_{10}-V_{TN}$ in the case of the nodes receiving the divided reference voltages $V_1$–$V_{20}$, the range of $V_{32}+|V_{TP}|$ to $V_{32}-V_{TN}$ in the case of the nodes receiving the $V_{21}$–$V_{43}$, and the range of $V_{54}+|V_{TP}|$ to $V_{54}-V_{TN}$ in the case of the node receiving the $V_{44}$–$V_{63}$), but a current will not flow in the bias voltage circuit after it reaches the predetermined voltage. Therefore, even if the conversion speed is increased, the power dissipation will not increase.

In this embodiment, before the pre-calibration period is shifted to the calibration period, for example, a bias voltage is applied from bias voltage circuit $B_1$ through the switch $S_{14}$ to the common node $N_{11}$ so that the parasitic capacitance $CS_1$ of the node $N_{11}$ stores an electric charge, and thereafter, when the pre-calibration period is shifted to the calibration period, the electric charge of the parasitic capacitance $CS_1$ influence the divided reference voltage $V_1$ through the closed switch $S_{11}$. Namely, electric charges stored in the parasitic capacitances $CS_1$–$CS_{63}$ will fluctuate the respective divided reference voltages $V_1$–$V_{63}$. However, since the resulting bias voltage $V_s$ supplied through the FET PMOS or NMOS in the bias voltage circuit is set near to the divided reference voltages $V_1$–$V_{63}$, the voltage fluctuation is small compared with the conventional A/D converter. Further, since the bias voltage $V_s$ is in a substantially constant range, differently from the analog signal voltage $V_{IN}$, it is possible to estimate the voltage fluctuation acting on the divided reference voltages $V_1$–$V_{63}$. Therefore, if the values of the resistors $R_0$–$R_{63}$ is set to compensate the voltage fluctuation, a more precise A/D converter can be obtained.

In this embodiment, only the resistors $R_0$–$R_{63}$ are required to have a high relative precision, i.e., a high precision in ratio of the values of the respective resistors. On the other hand, it is sufficient if the bias voltage circuit can supply a voltage near to the predetermined voltage. Therefore, the resistors $R_0$–$R_{63}$ and the respective bias voltages cannot be so high in precision.

In the above embodiment, the three different voltage levels (the divided reference voltages $V_{10}$, $V_{32}$ and $V_{54}$) are applied as the gate voltages $V_G$ to the three groups of the bias voltage circuits. The number of voltage levels applied as the gate voltage $V_G$ can be freely increased for more precise and higher A/D conversion.

The bias voltage circuit is not limited to the circuit shown in FIG. 3. If a large power dissipation is allowed, it is possible to use a source follower. In addition, each of the inverting amplifier is not necessarily associated with one independent bias voltage circuit. For example, the amplifiers can be divided into a suitable number of groups each including some amplifiers, and each group is associated with only one bias voltage circuit so that the bias voltage circuit is used commonly to all the amplifiers included in one group.

As mentioned above, the required precision is only the relative precision between the resistors $R_0$–$R_{63}$. In addition, the inverting amplifiers are of the self calibration type, and it is sufficient if the bias voltage circuit can supply a voltage near to the predetermined voltage. Therefore, a high precision is not required. The relative precision of the resistors $R_0$–$R_{63}$ can be sufficiently achieved to the degree of 8 bits if a current lithography for integrated circuit is used. Therefore, the A/D converter in accordance with the present invention is particularly suitable for an integrated circuit, specifically, a MOS IC.

The invention has thus been shown and described with reference to the specific embodiment. However, it should be noted that the invention is in no way limited to the details of the illustrated structures but changes and modifications may be made within the scope of the appended claims.

I claim:

1. An A/D converter comprising:
a resistor ladder composed of a plurality of resistors series-connected between a first reference potential and a second reference potential different from the first reference potential so that a connection tap between each pair of adjacent resistors provides a different divided reference potential;
at least one first switch means connected at its one end to one connection tap of the resistor ladder and at its other end to a common connection node;
at least one second switch means connected at its one end to an input for an analog voltage signal and at its other end to the common connection node;
at least one coupling capacitor connected at its one end to the common connection node;
at least one amplifier having an input connected to the other end of the coupling capacitor and an output adapted to generate an output signal representative of whether the voltage of the input signal is higher or lower than a voltage appearing at the above mentioned one connection tap of the resistor ladder;
at least one third switch means connected between the input and the output of the amplifier;
a bias voltage means for generating a fixed bias voltage independent of the voltage of the analog voltage signal and having an internal impedance smaller than that of the resistor ladder;
at least one fourth switch means connected between the bias voltage means and the common connection node so that the fixed bias voltage of the bias voltage means can be selectively applied to the common connection node without intermediary of the first and second switch means;
an encoder means connected to the output of the amplifier so as to generate a digital signal corresponding to the input analog signal; and
a switch controller for controlling the on-off of the first, second, third and fourth switch means in such a manner that
in a pre-calibration period the first and second switch means are opened and the third and fourth switch means are closed so that the common connection node is forcedly charged or discharged toward the fixed bias voltage of the bias voltage means at a first voltage changing rate per unit time;
in a calibration period succeeding to the pre-calibration period the second and fourth switch means are opened and the first and third switch means are closed so that the common connection node is forcedly charged or discharged to the divided reference potential at a second voltage changing rate per unit time smaller than the first voltage changing rate; and in a comparison period succeeding to the calibration period the first, third and fourth switch means are opened and only the second switch means is closed so that the analog signal voltage is supplied to the common connection node.

2. An A/D converter as claimed in claim 1 wherein the amplifier is composed of an inverting amplifier.

3. An A/D converter as claimed in claim 1 wherein the bias voltage means includes a bias voltage source and a CMOS circuit composed of a pair of P-channel MOS FET and N-channel MOS FET connected in series between the bias voltage source and ground, a common gate of the CMOS circuit being connected to a suitable gate bias voltage, and the node between the two FETs being connected to the corresponding fourth switch means.

4. An A/D converter comprising:
a resistor ladder composed of a plurality of resistors series-connected between a first reference potential and a second reference potential different from the first reference potential so that a connection tap between each pair of adjacent resistors provides a different divided reference potential;
a plurality of comparators each connected at its one input to one connection tap of the resistor ladder and at its other input to receive an analog voltage signal, each of the comparators including a first switch means connected at its one end to the above mentioned one connection tap of the resistor ladder and at its other end to a common connection node, a second switch means connected at its one end to an input for the analog voltage signal and at its other end to the common connection node, a coupling capacitor connected at its one end to the common connection node, an amplifier having an input connected to the other end of the coupling capacitor and an output adapted to generate an output signal representative of whether the voltage of the input signal is higher or lower than a voltage appearing at the above mentioned one connection tap of the resistor ladder, a third switch means connected between the input and the output of the amplifier, a bias voltage means for generating a fixed bias voltage independent of the voltage of the analog voltage signal and having an internal impedance smaller than that of the resistor ladder, a fourth switch means connected between the bias voltage means and the common connection node so that the fixed bias voltage of the bias voltage means can be selectively applied to the common connection node without intermediary of the first and second switch means;
an encoder means connected to the output of each comparator so as to generate a digital signal corresponding to the input analog signal; and
a switch controller for controlling the on-off of the first, second, third and fourth switch means of each comparator in such a manner that in a pre-calibration period the first and second switch means are opened and the third and fourth switch means are closed so that the common connection node is forcedly charged or discharged toward the fixed bias voltage of the bias voltage means at a first voltage changing rate per unit time;
in a calibration period succeeding to the pre-calibration period the second and fourth switch means are opened and the first and third switch means are closed so that the common connection node is forcedly charged or discharged to the divided reference potential at a second voltage changing rate per unit time smaller than the first voltage changing rate; and
in a comparison period succeeding to the calibration period the first, third and fourth switch means are opened and only the second switch means is closed so that the analog signal voltage is supplied to the common connection node.

5. An A/D converter as claimed in claim 4 wherein each amplifier is composed of an inverting amplifier.

6. An A/D converter as claimed in claim 4 wherein each of the bias voltage means includes a bias voltage source and a CMOS circuit composed of a pair of P-channel MOS FET and N-channel MOS FET connected in series between the voltage source and ground, a common gate of the CMOS circuit being connected to a suitable gate bias voltage, and the node between the two FETs being connected to the corresponding fourth switch means.

7. An A/D converter as claimed in claim 6 wherein the common gate of each CMOS circuit is applied with one bias voltage selected from a plurality of different gate bias voltages included in a range of a maximum voltage to a minimum voltage given by the resistor ladder.

8. An A/D converter comprising:
a resistor ladder composed of a plurality of resistors series-connected between a first reference potential and a second reference potential different from the first reference potential so that a connection tap between each pair of adjacent resistors provides a different divided reference potential;
a plurality of comparators each connected at its one input to one connection tap of the resistor ladder and at its other input to receive an analog voltage signal, each of the comparators including a first switch means connected at its one end to the above mentioned one connection tap of the resistor ladder and at its other end to a common connection node, a second switch means connected at its one end to an input for the analog voltage signal and at its other end to the common connection node, a coupling capacitor connected at its one end to the common connection node, an amplifier having an input connected to the other end of the coupling capacitor and an output adapted to generate an output signal representative of whether the voltage of the input signal is higher or lower than a voltage appearing at the above mentioned one connection tap of the resistor ladder, a third switch means connected between the input and the output of the amplifier, a bias voltage means individually provided one for each of the comparators and having an internal impedance smaller than that of the resistor ladder, the bias voltage means generating a fixed bias voltage which is independent of the voltage of the analog voltage signal and which is the same within one group of comparators respectively receiving a series of adjacent divided reference voltages obtained from a series of adjacent connection taps of the resistor ladder, a fourth switch means connected between the bias voltage means and the common connection node so that the fixed bias voltage of the bias voltage means can be selectively applied to the common connection node without intermediary of the first and second switch means;

an encoder means connected to the output of each comparator so as to generate a digital signal corresponding to the input analog signal; and a switch controller for controlling the on-off of the first, second, third and fourth switch means of each comparator in such a manner that in a pre-calibration period the first and second switch means are opened and the third and fourth switch means are closed so that the common connection node is forcedly charged or discharged toward the fixed bias voltage of the bias voltage means at a first voltage changing rate per unit time;

in a calibration period succeeding to the pre-calibration period the second and fourth switch means are opened and the first and third switch means are closed so that the common connection node is forcedly charged or discharged to the divided reference potential at a second voltage changing rate per unit time smaller than the first voltage changing rate; and in a comparison period succeeding to the calibration period the first, third and fourth switch means are opened and only the second switch means is closed so that the analog signal voltage is supplied to the common connection node.

9. An A/D converter comprising:

a resistor ladder composed of a plurality of resistors series-connected between a first reference potential and a second reference potential different from the first reference potential so that a connection tap between each pair of adjacent resistors provides a different divided reference potential;

at least one first switch means connected at its one end to one connection tap of the resistor ladder and at its other end to a common connection node;

at least one second switch means connected at its one end to an input for an analog voltage signal and at its other end to the common connection node;

at least one coupling capacitor connected at its one end to the common connection node;

at least one amplifier having an input connected to the other end of the coupling capacitor and an output adapted to generate an output signal representative of whether the voltage of the input signal is higher or lower than a voltage appearing at the above mentioned one connection tap of the resistor ladder;

at least one third switch means connected between the input and the output of the amplifier;

a bias voltage means having an internal impedance smaller than that of the resistor ladder, the bias voltage means including a bias voltage source and a CMOS circuit composed of a pair of P-channel MOS FET and N-channel MOS FET connected in series between the voltage source and ground, a common gate of the CMOS circuit being connected to a suitable gate bias voltage, the CMOS circuit generating at the node between the two FETs a fixed bias voltage independent of the voltage of the analog voltage signal;

at least one fourth switch means connected between the common connection node and the node between the two FETs of the bias voltage means so that the fixed bias voltage of the bias voltage means can be selectively applied to the common connection node without intermediary of the first and second switch means;

an encoder means connected to the output of the amplifier so as to generate a digital signal corresponding to the input analog signal; and a switch controller for controlling the on-off of the first, second, third and fourth switch means in such a manner that in a pre-calibration period the first and second switch means are opened and and the third and fourth switch means are closed so that the common connection node is forcedly charged or discharged toward the fixed bias voltage of the bias voltage means at a first voltage changing rate per unit time;

in a calibration period succeeding to the pre-calibration period the second and fourth switch means are opened and the first and third switch means are closed so that the common connection node is forcedly charged or discharged to the divided reference potential at a second voltage changing rate per unit time smaller than the first voltage changing rate; and in a comparison period succeeding to the calibration period first, third and fourth switch means are opened and only the second switch means is closed so that the analog signal voltage is supplied to the common connection node.

* * * * *